United States Patent [19]

Ikeda et al.

[11] Patent Number: 5,371,477
[45] Date of Patent: Dec. 6, 1994

[54] LINEAR AMPLIFIER

[75] Inventors: Hikaru Ikeda, Takatsuki; Toshio Ishizaki, Kobe; Hiroaki Kosugi, Hirakata; Yoshishige Yoshikawa, Kashihara; Kunihiko Kanazawa, Muko, all of Japan

[73] Assignee: Matsushita Electric Industrial Co. Ltd., Osaka, Japan

[21] Appl. No.: 924,937

[22] Filed: Aug. 5, 1992

[30] Foreign Application Priority Data

Aug. 5, 1991 [JP] Japan .................. 3-195169
Nov. 29, 1991 [JP] Japan .................. 3-315787

[51] Int. Cl.$^5$ ............................................ H03G 3/10
[52] U.S. Cl. ................................. 330/282; 330/285
[58] Field of Search ............... 330/86, 110, 136, 277, 330/278, 279, 282, 285, 290; 485/116, 126, 127, 232.1, 234.1; 375/71, 98

[56] References Cited

U.S. PATENT DOCUMENTS

| | | | |
|---|---|---|---|
| 4,096,444 | 6/1978 | Fellrath | 330/277 |
| 4,264,874 | 4/1981 | Young | 330/296 X |
| 4,500,848 | 2/1985 | Marchand et al. | 330/277 X |
| 4,737,733 | 4/1988 | LaPrade | 330/277 |
| 5,051,705 | 9/1991 | Moghe et al. | 330/282 X |

FOREIGN PATENT DOCUMENTS

| | | | |
|---|---|---|---|
| 39611 | 2/1986 | Japan | 330/284 |
| 31612 | 12/1989 | Japan | 330/282 |
| 2154819 | 9/1985 | United Kingdom | 330/277 |

*Primary Examiner*—William L. Sikes
*Attorney, Agent, or Firm*—Wenderoth, Lind & Ponack

[57] ABSTRACT

A linear amplifier has an input signal controller for controlling the level of an input signal to a field-effect transistor (FET) using a DC gate current measured by a gate current detector arranged between a gate bias terminal and a drain bias terminal of the FET and a nonlinear resistor whose resistance can be varied correspondingly to an inter-terminal voltage between the gate and the drain of the FET, in which the voltage at the gate of the FET is adjusted to a rate such that a particular drain current which has been determined just before the starting of burst signal transmission corresponding to the level of a power output of the linear amplifier is obtained, and is maintained for a given period of time.

6 Claims, 7 Drawing Sheets

[ Fig. 1 ]
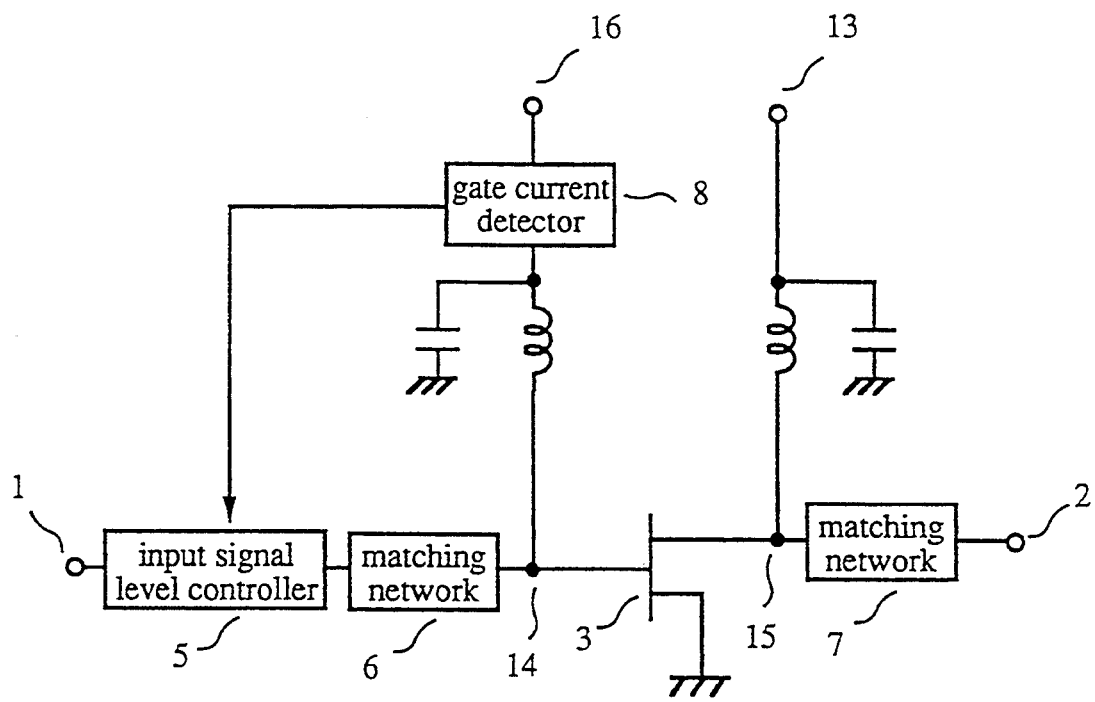
[ Fig.2 ]
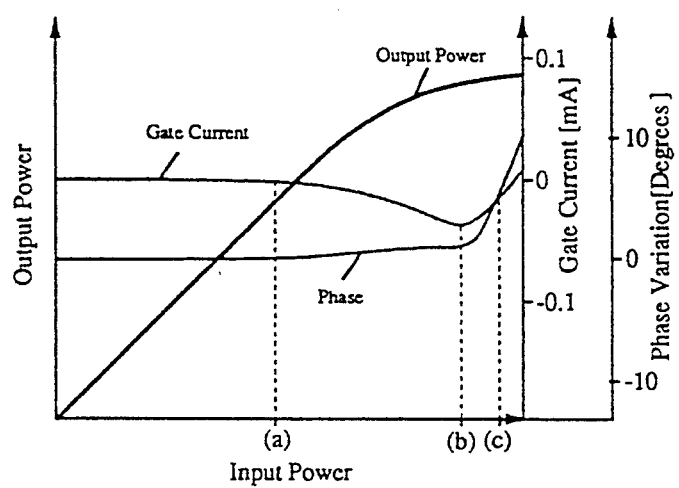

[ Fig.3 ]
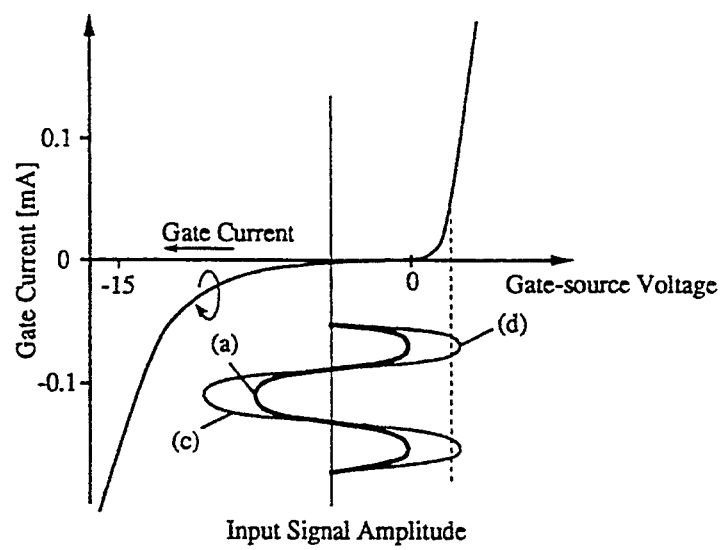
[ Fig.4 ]
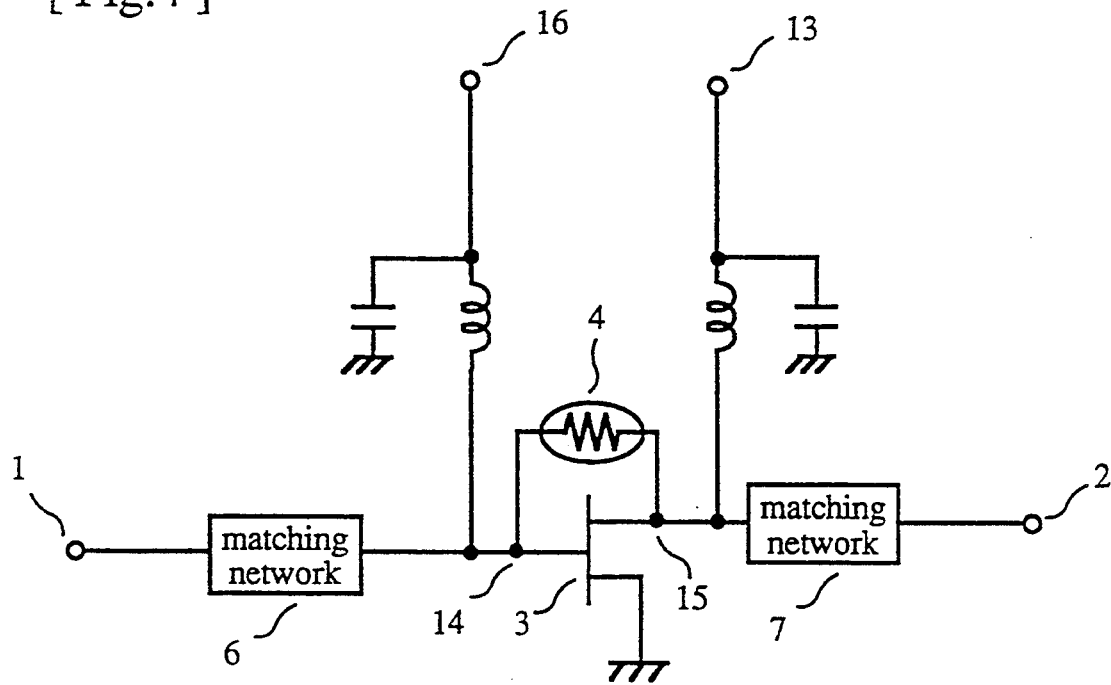

[ Fig.5 ]
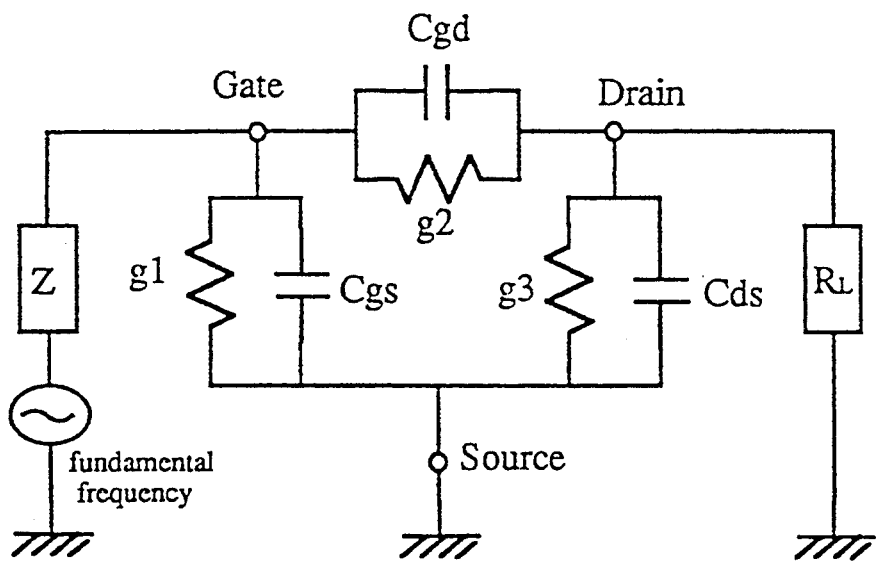
[ Fig.6 ]
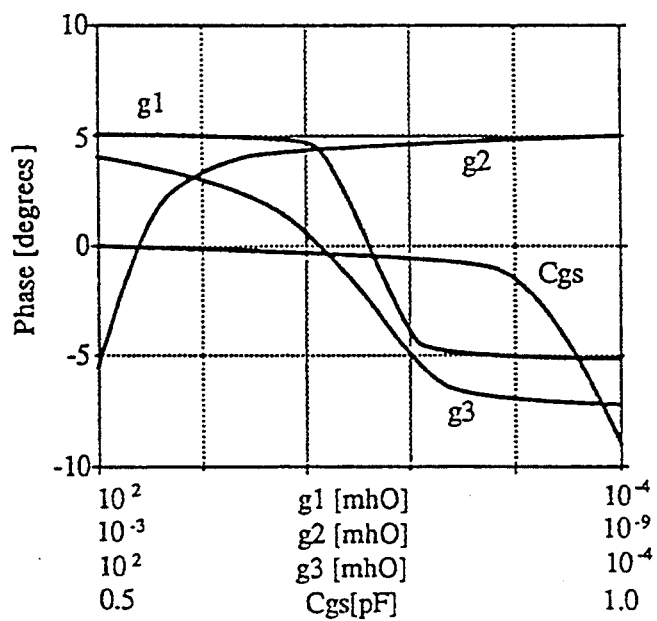

[ Fig.7 ]
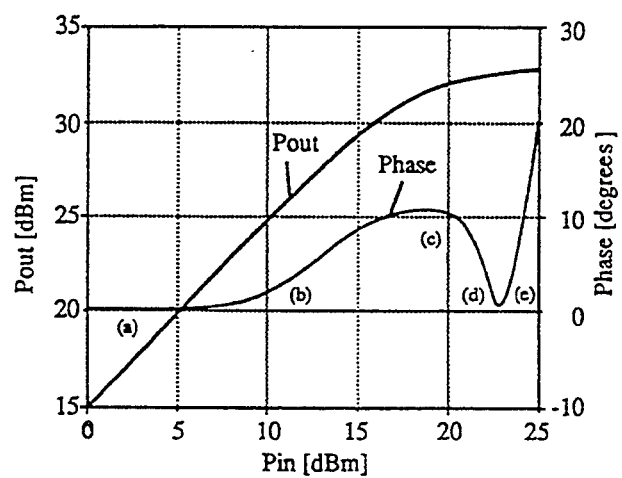
[ Fig.8 ]
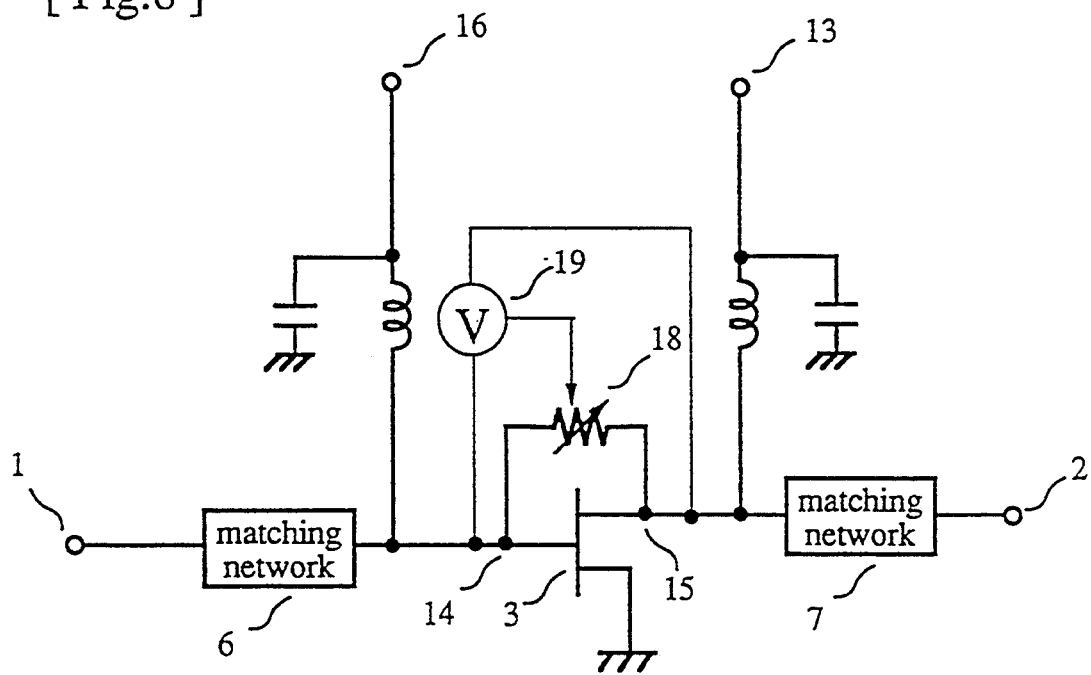

[Fig.9]
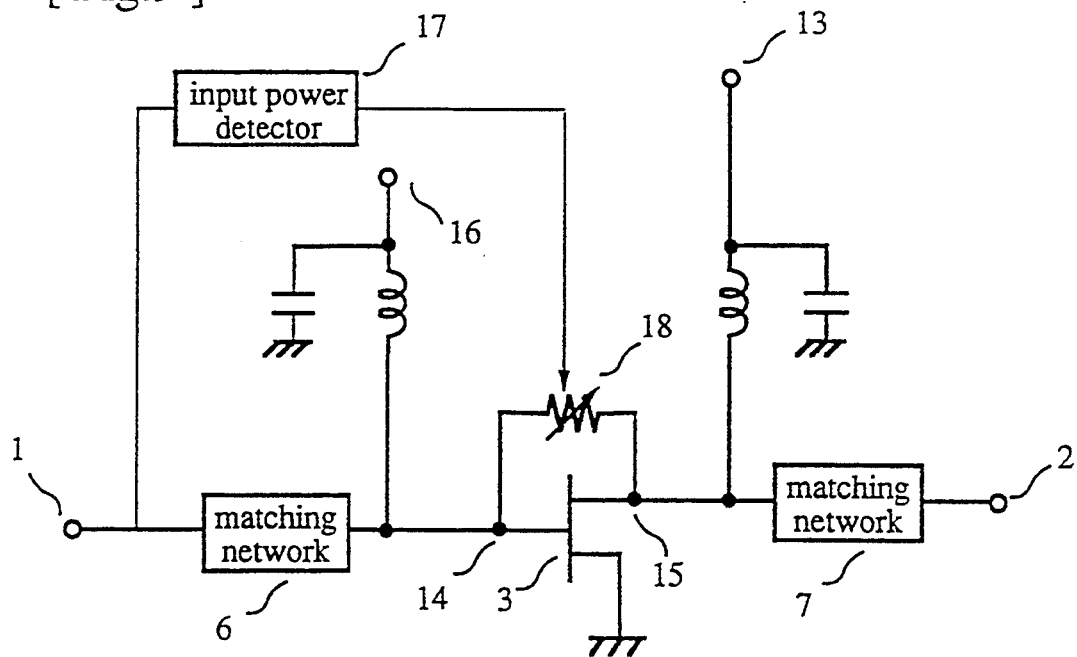
[Fig.10]
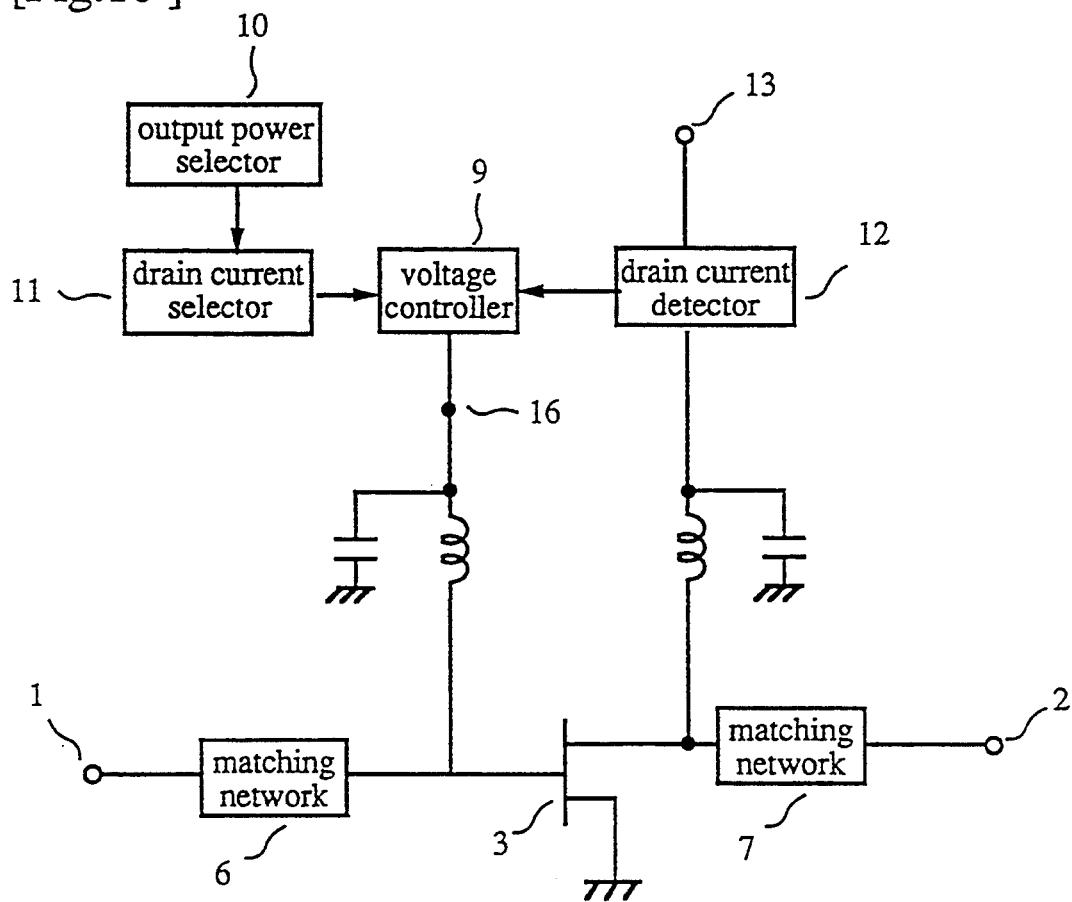

[ Fig.11 ]
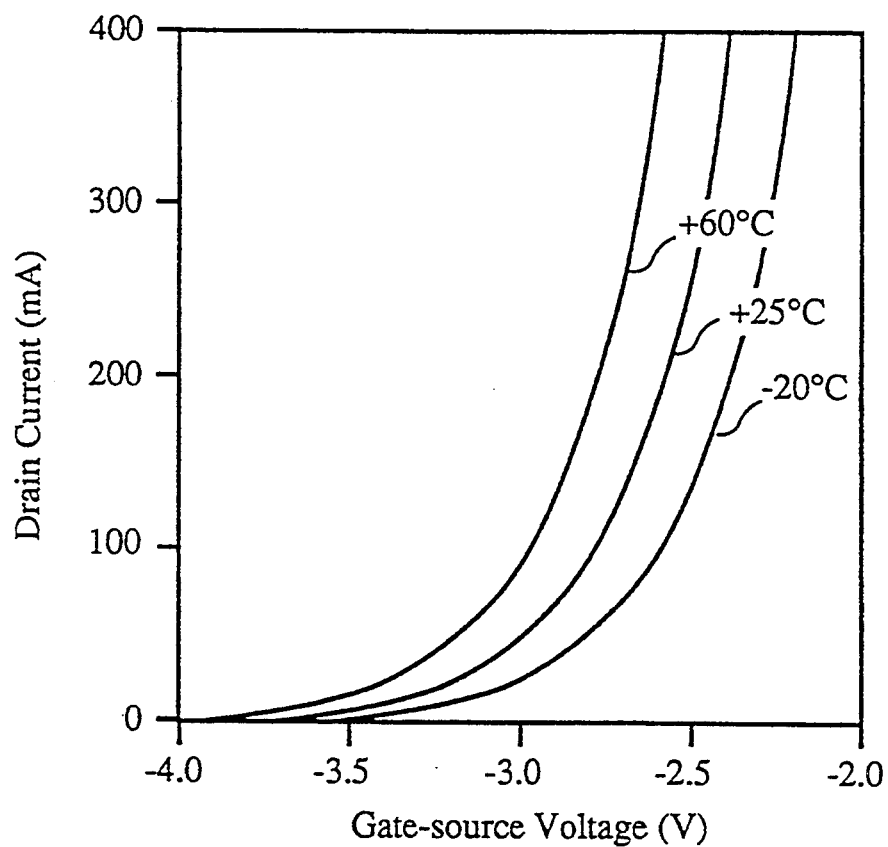
[ Fig.12(a) ]
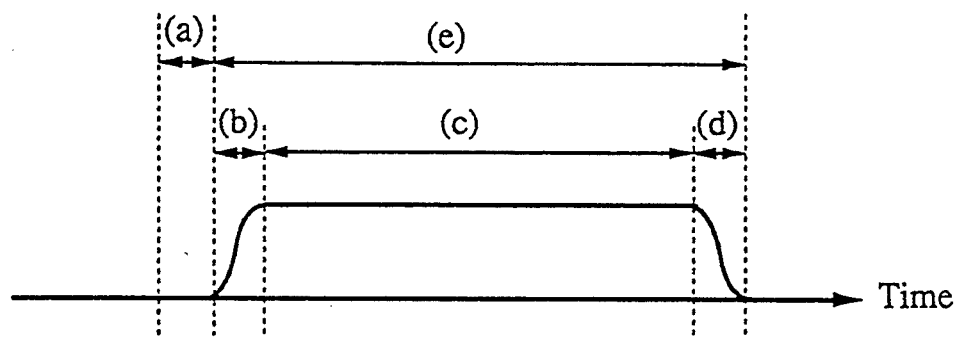
[ Fig.12(b) ]
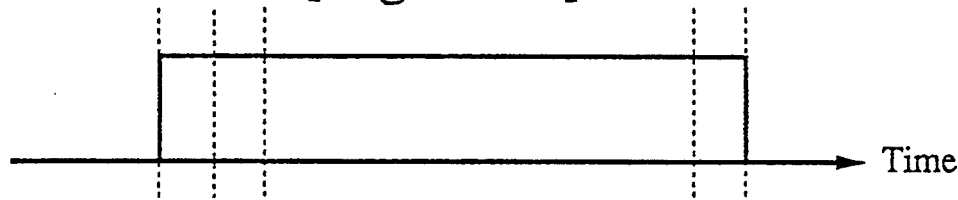

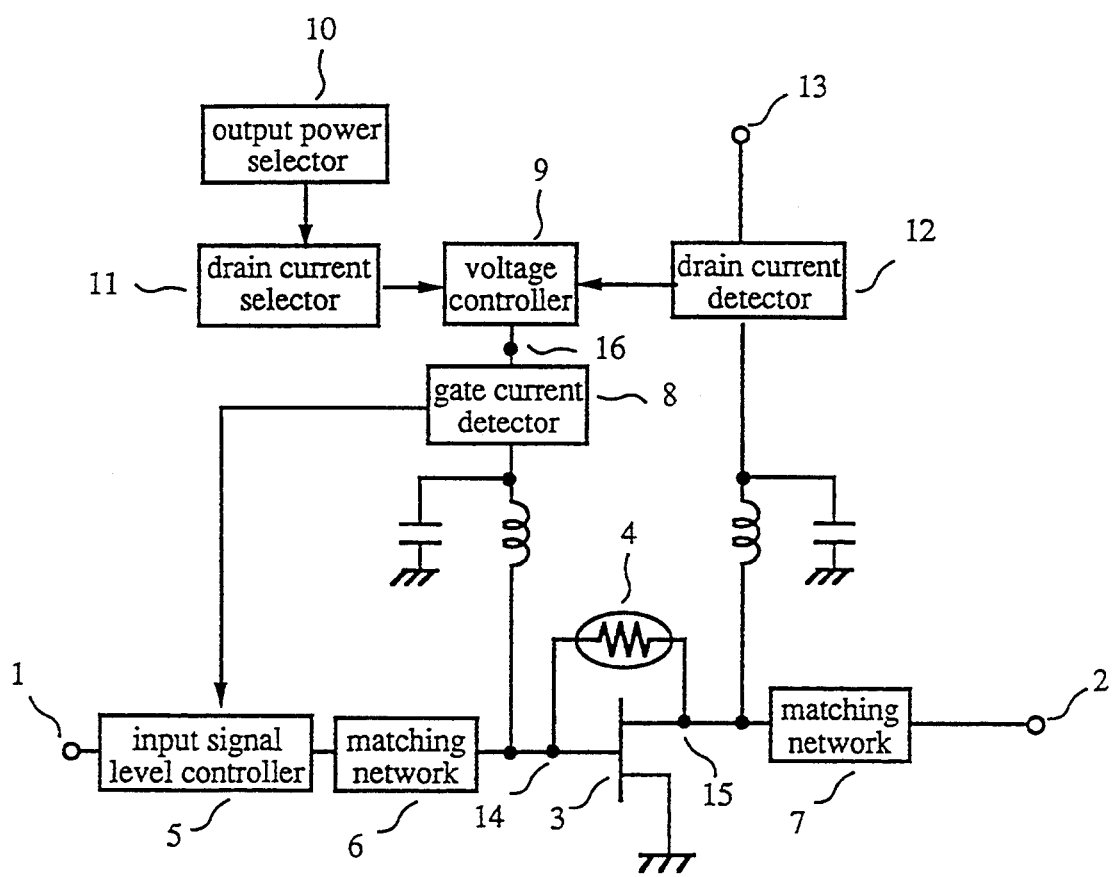
[ Fig.13 ]

5,371,477

LINEAR AMPLIFIER

BACKGROUND OF THE INVENTION

1. Field of the Invention

The present invention relates to a linear amplifier for amplifying a multiple-level PSK modulated signal, which is commonly used for digital communications, at low distortion and high power efficiency.

2. Description of the Prior Art

It is desirable for transmitter amplifiers for digital radio communication systems such as cellular telephones to operate at low distortion and high power efficiency. In particular, phase distortion is of great concern. It is also desirable for the low distortion and the high power efficiency to be effected regardless of temperature changes. Such traditional linear amplifiers are explained below.

In common, field-effect transistors (FET) having a high power efficiency and thus, capable of operating at a low drain voltage are used in cellular telephones. Although such FET amplifiers serves as linear amplifiers when operated as class "A" amplifiers, they have a low power efficiency when comparing DC power consumption to output power. If the FET amplifiers operate as class "AB" amplifiers in which the power efficiency becomes high, they tend to produce considerable amounts of distortion and will hardly be suited to act as the linear amplifiers. For compensation for nonlinearity, linear amplification correcting circuits have been introduced (for example, as depicted in "Linear amplification with nonlinear components", IEEE Transaction on Communications, December, 1974). However, such linear amplification correcting circuits are bulky and have a high energy consumption and will hardly be applicable to cellular telephones which should consume the lowest amount of energy.

It is known that a FET amplifier ensures a high power efficiency when the gate voltage of an FET is close to a pinchoff level under bias conditions but produces distortion at the same time. Hence, the gate voltage is predetermined for ensuring both a high power efficiency and a low distortion. As the gate voltage of the FET amplifier is varied by a change in the ambient temperature, an extra circuit is needed for determining a proper rate of the gate voltage upon measuring the ambient temperature. However, this technique causes the drain current of the FET to be unstable due to e.g. unavoidable error in the temperature measurement. Accordingly, the drain current has to be set to a greater level for averting the phase distortion, thus reducing the power efficiency.

SUMMARY OF THE INVENTION

For preventing a steep increase in the phase variation of a field-effect transistor (FET) amplifier and for minimizing the resultant signal interference to an adjacent channel, an input signal controller circuit is provided which controls the level of an input signal to the FET amplifier according to a DC gate current measured by a gate current detector circuit arranged at the gate bias terminal of the FET amplifier.

For minimizing the phase variation of an output from an input in an FET amplifier, a nonlinear resistor is inter-posed between the gate terminal and the drain terminal of an FET for varying the resistance in response to an inter-terminal voltage. Accordingly, the signal interference to another channel which results from spectral overswing at the output terminal during amplification of a multiple-level PSK signal will be minimized.

The gate terminal voltage is set at a timing just before starting the burst transmission such that the drain current becomes a predetermined value according to the transmitting power. By holding the thus set gate terminal voltage, the amplifier is operable at low distortion and high power efficiency in any operating condition including varying temperature characteristics.

BRIEF DESCRIPTION OF THE DRAWINGS

FIG. 1 is a block diagram of an amplifier in accordance with a first embodiment of the present invention;

FIG. 2 is a diagram of the input/output characteristics of the FET amplifier for explaining the operation of the first embodiment;

FIG. 3 is a gate current generation diagram showing the relationship between an input power and a gate current in the FET amplifier for explaining the generation of the gate current;

FIG. 4 is a block diagram of an amplifier in accordance with a second embodiment of the present invention;

FIG. 5 is a circuit diagram of a nonlinear FET equivalent circuit for explaining the operation of the second embodiment;

FIG. 6 is a diagram showing the phase variation of each nonlinear element in the nonlinear FET equivalent circuit for explaining the operation of the second embodiment;

FIG. 7 is a diagram of input/output characteristics of a conventional FET amplifier for the purpose of comparison with the second embodiment;

FIG. 8 is a block diagram of an amplifier in accordance with a third embodiment of the present invention;

FIG. 9 is a block diagram of an amplifier in accordance with a fourth embodiment of the present invention;

FIG. 10 is a block diagram of an amplifier in accordance with a fifth embodiment of the present invention;

FIG. 11 is a diagram of thermal characteristics of a drain current in the FET amplifier for explaining the operation of the fifth embodiment;

FIGS. 12(a)–12(b) are timing charts of a burst signal and a power supply for explaining the operation of the fifth embodiment; and FIG. 13 is a block diagram of an amplifier in accordance with a sixth embodiment of the present invention.

DESCRIPTION OF THE PREFERRED EMBODIMENTS

A first embodiment of the present invention is described below referring to the accompanying drawings.

As shown in FIG. 1, an input signal fed to an input terminal 1 is transmitted through a matching network 6 to an FET 3 where it is amplified before being output from an output terminal 2. A drain bias terminal 13 and a gate bias terminal 16 are also provided for inputting and outputting a direct current across the FET 3. A gate current detector circuit 8 is arranged between the gate bias terminal 16 and the FET 3 for detection of a DC gate current. In addition, an input signal level controller circuit 5 is provided for controlling the level of the input signal to the FET 3 using a current value supplied from the gate current detector circuit 8.

The action of such a linear amplifier having the foregoing arrangement will be explained referring to FIGS. 1, 2, and 3.

The input signal of an AC mode from the input terminal 1 is regulated to be at a given level by the input signal level controller circuit 5 and fed to the input of the FET 3 where it is amplified. The amplified signal is then outputted from the output terminal 2. A DC power source is connected across the gate bias terminal 16 and the drain bias terminal 13 for actuation of the FET 3.

FIG. 2 is a input/output characteristics diagram of the FET 3 showing an output amplified from the input signal, a gate current, and a phase variation across the FET 3. As the input power to the FET 3 is increased, the gate current becomes to negative at the point (a) and reaches its lowest negative value at the point (b). As the input power is increased further from the point (b), the phase variation increases sharply at the point (c).

FIG. 3 illustrates the relationship between the input power and the gate current in the FET 3. When the input signal is like as denoted by the solid line (as appearing about the point (a) in FIG. 2), the gate current remains negative due to a voltage between the gate and the drain. When the input signal has a waveform denoted by the broken line (as appearing about the point (c) in FIG. 2), the gate-source voltage becomes positive at the point (d) in FIG. 3 for a moment, thus allowing the gate current to steeply increase to positive. This action causes a sharp rise in the phase variation.

As understood, the first embodiment of the present invention permits the input signal to the FET 3 to be regulated to be at a specific level by the input signal level controller circuit 5 corresponding to a gate current value which is detected by and supplied from the gate current detector circuit 8. Hence, a sharp rise in the phase variation in the FET 3 can be avoided.

Also, it is a good idea for the gate current detector circuit 8 to detect a peak current, thus to preventing the flow of a high positive gate current across the FET 3 and allowing no excessive phase variation.

Furthermore, a gain controller circuit may be provided for control of the input signal level to the FET 3 instead of using a gate current value or a level controller circuit may be provided for controlling the level of a baseband signal fed to the input of the FET 3. The gain controller circuit is preferably formed of a variable attenuator with a PIN diode or a dual gate FET.

A second embodiment of the present invention is described below referring the accompanying drawings.

As shown in FIG. 4, an input signal fed to an input terminal 1 is transmitted through a matching network 6 to an FET 3 where it is amplified. The amplified signal is then fed to a matching network 7 and output from an output terminal 2. A drain bias terminal 13 and a gate bias terminal 16 are also provided for inputting and outputting a direct current across the FET 3. A nonlinear resistor 4 which resistance is varied by an inter-terminal voltage is arranged between a gate terminal 14 and a drain terminal 15 of the FET 3.

The action of this linear amplifier will be explained referring to FIGS. 4, 5, 6, and 7.

The input signal from the input terminal 1 is fed to the input of the FET 3 where it is amplified before being transmitted to the output terminal 2. The resistance of the nonlinear resistor 4 is varied by the inter-terminal voltage between the gate terminal 14 and the drain terminal 15 of the FET 3 causing a change in the feedback amount across the FET 3. A DC power source is coupled to the drain bias terminal 13 and the gate bias terminal 16 for operating the FET 3.

FIG. 5 shows a nonlinear FET model circuit for providing an analytic explanation of a change in the phase of an input signal. For ease of explanation of the behavior of a phase variation, the nonlinear FET model circuit of FIG. 5 is illustrated as a simplified form of a known nonlinear circuit in which the phase shift is of most concern. In the model circuit, four nonlinear elements are decomposed into harmonic components which are assigned as linear elements for the fundamental frequency. Hence, each element is variable corresponding to the input power and the bias voltage. Denoted by Cgs is a gate-source capacitance which is decreased proximate to a given value at pinchoff as Vgs becomes small. A gate-source conductance g1 stays small enough to be negligible when Vgs is negative at a high withstanding voltage between the gate and the source and will increase sharply when Vgs is positive. A gate-drain conductance g2 is related to a gate-drain withstanding voltage Vgd. When Vgd is increased, current leakage occurs and g2 will thus be increased. A drain-source conductance g3 depends on a gain and a load impedance of the amplifier for the fundamental frequency and will be increased when the gain becomes small. Other two capacitances Cgd and Cds are assumed to remain constant. FIG. 6 shows phase variations of an input signal relative to g1, g2, g3, and Cgs being varied. As shown, the phase is advanced when g1 and g3 increase and retarded when g2 and Cgs increase.

Phase variation in a common FET amplifier according to the action of the FET model of FIG. 5 explained as follows referring to FIG. 7. As shown, no phase variation appears at the point (a) during class "A" amplification. When the input power is at the point (b), the phase curve deviates close to pinchoff. As the result, the gain is reduced and g3 is increased so that the phase is advanced. When the input power is at the point (c), breakdown between the gate and the drain causes current leakage. This increases g2 and the phase is thus retarded. When the input power is at the point (d), Cgs increases and the phase is further retarded. When the input power reaches the point (e), Vgs turns to positive and the gate receives a current. Hence, g1 in-creases sharply and the phase is advanced radically. It is now understood that such a phase variation at the point (b) can be eliminated by increasing g2 as proved at the point (c).

According to the second embodiment of the present invention, an increase of g3 caused by a reduction in the gain of the FET amplifier is detected by measuring the drain-gate voltage. The phase variation in the FET amplifier can thus be minimized by interposing between the gate and the drain a nonlinear resistor which provides a variable resistance corresponding to the terminal voltage for offsetting the phase variation.

A third embodiment of the present invention is described below referring to the drawings.

As shown in FIG. 8, an input signal fed to an input terminal 1 is transmitted through a matching network 6 to an FET 3 where it is amplified. The amplified signal is then fed to a matching network 7 and outputted from an output terminal 2. A drain bias terminal 13 and a gate bias terminal 16 are also provided for inputting and outputting a direct current across the FET 3. A variable resistor 18 and a voltage detector circuit 19 for measurement of an inter-terminal voltage are arranged between a gate terminal 14 and a drain terminal 15 of the FET 3.

The action of this linear amplifier is explained below, referring to FIG. 8.

The input signal from the input terminal 1 is fed to the input of the FET 3 where it is amplified before being transmitted to the output terminal 2. The inter-terminal voltage between the gate terminal 14 and the drain terminal 15 of the FET 3 is detected by the voltage detector circuit 19 and fed to the variable resistor 18 which determines a resistance value in response thereto so that the feedback of the FET 3 is properly controlled. Meanwhile, a DC power source is connected to the drain bias terminal 13 and the gate bias terminal 16 for operating the FET 3.

The phase variation in the FET amplifier is closely subjected to a decrease in the gain of the FET 3, as explained with respect to the second embodiment. For compensation for the decrease, the voltage between the gate and the drain is detected and used for the control of the variable resistor 18.

According to the third embodiment, the phase variation caused by an increase of g3, shown in FIG. 6, due to a decrease in the gain of the FET 3 can be minimized by measuring a voltage between the gate and the drain of the FET 3 with the voltage detector circuit 19 and controlling the variable resistor 18 interposed between the gate and the drain with the gate-drain voltage.

A fourth embodiment of the present invention is described below, referring to the drawings.

As shown in FIG. 9, an input signal fed to an input terminal 1 is transmitted through a matching network 6 to an FET 3 where it is amplified. The amplified signal is then fed to a matching network 7 and outputted from an output terminal 2. A drain bias terminal 13 and a gate bias terminal 16 are also provided for inputting and outputting a direct current across the FET 3. A variable resistor 18 is arranged between a gate terminal 14 and a drain terminal 15 of the FET 3.

The operation of this linear amplifier is explained below, referring to FIG. 9.

The input signal from the input terminal 1 is fed to the input of the FET 3 where it is amplified before being transmitted to the output terminal 2 for output. The variable resistor 18 is controlled by an input power level measured by an input power detector 17 coupled to the input of the FET 3 so that the feedback of the FET 3 can be properly adjusted. Also, a DC power source is connected to the drain bias terminal 13 and the gate bias terminal 16 for operating of the FET 3.

The phase variation in the FET amplifier is closely subjected to a decrease in the gain of the FET 3, as explained with respect to the second embodiment. For compensation for the decrease, the level of the input power is detected by the input power detector 17 and used for control of the variable resistor 18.

According to the fourth embodiment, the phase variation caused by an increase of g3 shown in FIG. 5 due to a decrease in the gain of the FET 3 can be minimized by measuring an input power level with the input power detector 17 and controlling the variable resistor 18 interposed between the gate and the drain with the measured input power level.

In the third or fourth embodiment, the variable resistor 18 interposed between the gate and the drain of the FET 3 may be a semiconductor device such as an FET.

A fifth embodiment of the present invention is described below referring to the drawings.

As shown in FIG. 10, an input signal fed to an input terminal 1 is transmitted through a matching network 6 to an FET 3 where it is amplified. The amplified signal is then fed to a matching network 7 and outputted from an output terminal 2. A drain bias terminal 13 and a gate bias terminal 16 are also provided for inputting and outputting a direct current across the FET 3. The drain bias terminal 13 is coupled to a drain current detector circuit 12 for detection of a DC drain current. The gate bias terminal 16 is coupled to a voltage controller circuit 9 for varying a gate terminal voltage. Also, a drain current selector circuit 11 is provided. The drain current selector circuit receives the level of an output power from the output terminal 2, as generated by an output power selector circuit 10. Both an actual drain current value from the drain current detector circuit 12 and a desired drain current value from the drain current selector circuit 11 are supplied to the voltage controller circuit 9.

The operation of this linear amplifier is explained below, referring to FIGS. 10, 11, 12a and 12b.

As shown in FIG. 10, the input signal from the input terminal 1 is fed to the input of the FET 3 where it is amplified to a specific level determined by the output power selector circuit 10 before being transmitted to the output terminal 2. In more detail, a DC drain current is supplied from the drain bias terminal 13 via the drain current detector 12 to a drain terminal 15 of the FET 3. Also, the output power selector circuit 10 determines the level of a modulated signal to be delivered from the output terminal 2 and sends its signal to the drain current selector circuit 11 which, in response thereto, determines the level of the DC drain current for ensuring low distortion and high power efficiency. In succession, the voltage controller circuit 9 determines the level of a voltage at the gate bias terminal 16 so that an actual drain current to be measured by the drain current detector circuit 12 is equal to the predetermined value set by the drain current selector circuit 11.

FIG. 11 shows the thermal characteristics of the drain current in relation to the gate terminal voltage of the FET 3. As is apparent, the drain current is increased when the temperature rises with the application of a given gate terminal voltage and decreased when the temperature drops. It is thus necessary for the voltage to the gate terminal to be varied corresponding to a change in the ambient temperature for maintaining the drain current constant. Also, the relationship between the drain current and the distortion when no input signal is fed remains unchanged regardless of the temperature change. Hence, the distortion under any ambient temperature can be maintained constant by providing a constant value of the drain current while no input signal is input.

FIGS. 12(a)–12(b) are timing charts of a burst signal and a power supply. As shown in FIG. 12(a), the burst signal rises at a period of (b), carries data throughout a period of (c), and decays at a period of (d). The energization of the amplifier is started at a period of (a) prior to the rise of the burst signal and the gate terminal voltage is maintained throughout a period of (e) before deenergization. The gate terminal voltage of the FET described in conjunction with FIG. 10 is determined during the period (a) and held as shown in FIG. 121b).

According to the fifth embodiment, the gate terminal voltage of an FET is determined before transmission of a burst signal so that the drain current to the FET is equal to a desired predetermined value corresponding to the output level and held throughout the transmission of the burst signal. As the result, the amplifier will have a distortion and a high power efficiency under all the conditions including temperature changes.

A sixth embodiment of the present invention is described below referring to the drawings.

As shown in FIG. 13, an input signal fed to an input terminal 1 is transmitted through a matching network 6 to an FET 3 where it is amplified. The amplified signal is then fed to a matching network 7 and outputted from an output terminal 2. A drain bias terminal 13 and a gate bias terminal 16 are also provided for inputting and outputting a direct current across the FET 3. The gate bias terminal 16 for the FET 3 is coupled to a gate current detector circuit 8 for detection of a DC gate current. An input signal level controller circuit 5 is provided for controlling the level of an input signal to the FET 3 with a gate current value fed from the gate current detector circuit 8. Also, a nonlinear resistor 4 whose resistance is varied by an inter-terminal voltage is provided between a gate terminal 14 and a drain terminal 15 of the FET 3. The drain bias terminal 13 is coupled to a drain current detector circuit 12 for detection of a DC drain current. The gate bias terminal 16 is at the other end coupled to a voltage controller circuit 9 for varying the gate terminal voltage. In addition, a drain current selector circuit 11 is provided. The drain current selector circuit 11 receives the level of the output power from the output terminal 2, generated by an output power selector circuit 10. Both an actual drain current value from the drain current detector circuit 12 and a desired drain current value from the drain current selector circuit 11 are supplied to the voltage controller circuit 9.

The operation of this amplifier is explained below, referring to FIG. 13.

As shown in FIG. 13, the amplifier consists of the particular circuits described in the first, second, and fifth embodiments. The operation of the circuits are as explained previously.

According to the sixth embodiment, the gate current of the FET 3 is detected by the gate current detector circuit 8 and fed to the input signal level controller circuit 5 which in turn determines the level of an input signal so that a steep increase in the phase variation of the amplifier can be averted. Also, the nonlinear resistor 4 is interposed between the gate and the drain of the FET 3 for providing a desired resistance corresponding to the gate-drain voltage which represents an increase of g3 caused by a decrease in the gain of the FET 3, whereby the phase variation in the amplifier will be minimized. Furthermore, the gate voltage of the FET 3 is adjusted to a rate such that the drain current is equal to a desired predetermined level to match the output power level before transmission of a burst signal and maintained during the transmission of the burst signal. As the result, the amplifier will have a low the distortion and a high power efficiency under all the conditions including temperature changes.

Although the sixth embodiment employs a nonlinear resistor, the circuit arrangement of the third or fourth embodiment is also applicable with equal success. Any combination of the foregoing circuits will contribute to the low distortion and high power efficiency of the amplifier.

What is claimed is:

1. A linear amplifier comprising:
   a field-effect transistor for amplifying an input signal inputted to a gate terminal thereof to obtain an amplified signal at a drain terminal thereof;
   a current detecting circuit coupled to said gate terminal of said field-effect transistor for detecting a peak current of a gate current of said field-effect transistor; and
   a control means coupled to said current detecting circuit for controlling a level of said input signal according to said peak current of said gate current so as to prevent a flow of a positive gate current through said field-effect transistor.

2. A linear amplifier according to claim 1, wherein said control means comprises a gain controlling circuit coupled to said gate terminal of said field-effect transistor for controlling the level of said input signal.

3. A linear amplifier according to claim 1, wherein said control means comprises a level controlling circuit coupled to said gate terminal of said field-effect transistor for controlling the level of a baseband signal contained within said input signal.

4. A linear amplifier comprising:
   a field-effect transistor for amplifying an input signal inputted to a gate terminal thereof to obtain an amplified signal at a drain terminal thereof;
   a voltage detecting circuit for detecting an inter-terminal voltage between said gate and drain terminals of said field-effect transistor; and
   a variable resistor interposed between said gate terminal and said drain terminal of said field-effect transistor and controlled by said inter-terminal voltage detected by said voltage detecting circuit, said variable resistor having a resistance which decreases with an increase of the inter-terminal voltage so as to maintain a phase of the amplified output signal at a constant value.

5. A linear amplifier comprising:
   a field-effect transistor for amplifying an input signal inputted to a gate terminal thereof to obtain an amplified signal at a drain terminal thereof;
   an input level detecting circuit for detecting a level of said input signal; and
   a variable resistor interposed between said gate terminal and said drain terminal of said field-effect transistor and controlled by the level of said input signal detected by said input level detecting circuit, said variable resistor having a resistance which decreases with an increase of the level of said input signal so as to maintain a phase of the amplified output signal at a constant value.

6. A linear amplifier for amplifying an input signal which intermittently becomes a burst signal, comprising:
   a field-effect transistor for amplifying the input signal inputted to a gate terminal thereof to obtain an amplified signal at a drain terminal thereof;
   a current detecting circuit for detecting a drain current of said field-effect transistor;
   an output power selector for selecting an output power of the linear amplifier;
   a current selector for setting a reference drain current corresponding said output Dower selected by said output power selector;
   a voltage controlling circuit coupled to said current detecting circuit, said current selector and said gate terminal of said field-effect transistor for adjusting a gate voltage of said field-effect transistor such that said drain current detected by said current detecting circuit becomes equal to said reference drain current just before a starting of the burst signal, and for maintaining the adjusted gate voltage for a given period of time.

* * * * *